United States Patent [19]

Kang

[11] 4,271,423
[45] Jun. 2, 1981

[54] V-GROOVE SEMICONDUCTOR DEVICE WITH BURIED CHANNEL STOP

[75] Inventor: S. Daniel Kang, Houston, Tex.

[73] Assignee: Texas Instruments Incorporated, Dallas, Tex.

[21] Appl. No.: 1,096

[22] Filed: Jan. 5, 1979

[51] Int. Cl.³ .............................................. H01L 29/06
[52] U.S. Cl. ...................................... 357/55; 357/23; 357/52; 357/58
[58] Field of Search ........................ 357/23, 52, 55, 58

[56] References Cited

U.S. PATENT DOCUMENTS

| | | | |
|---|---|---|---|
| 4,105,475 | 8/1978 | Jenne | 357/55 |
| 4,116,720 | 9/1978 | Vinson | 357/55 |

Primary Examiner—Edward J. Wojciechowicz
Attorney, Agent, or Firm—John G. Graham

[57] ABSTRACT

An insulated gate field effect transistor has channel stop regions which are separated from the heavily doped drain region so that the sidewall or drain/source to channel stop capacitance is reduced. This is accomplished by a buried outdiffused channel region which also functions as the channel stop in a VMOS transistor.

10 Claims, 4 Drawing Figures

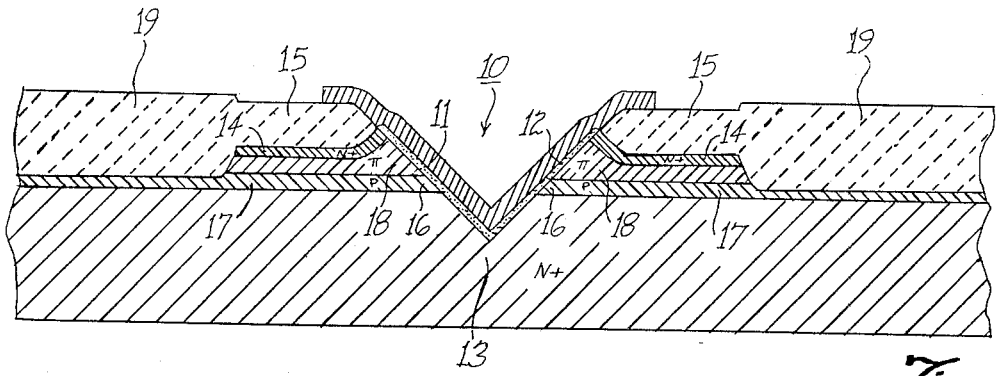
Fig. 1
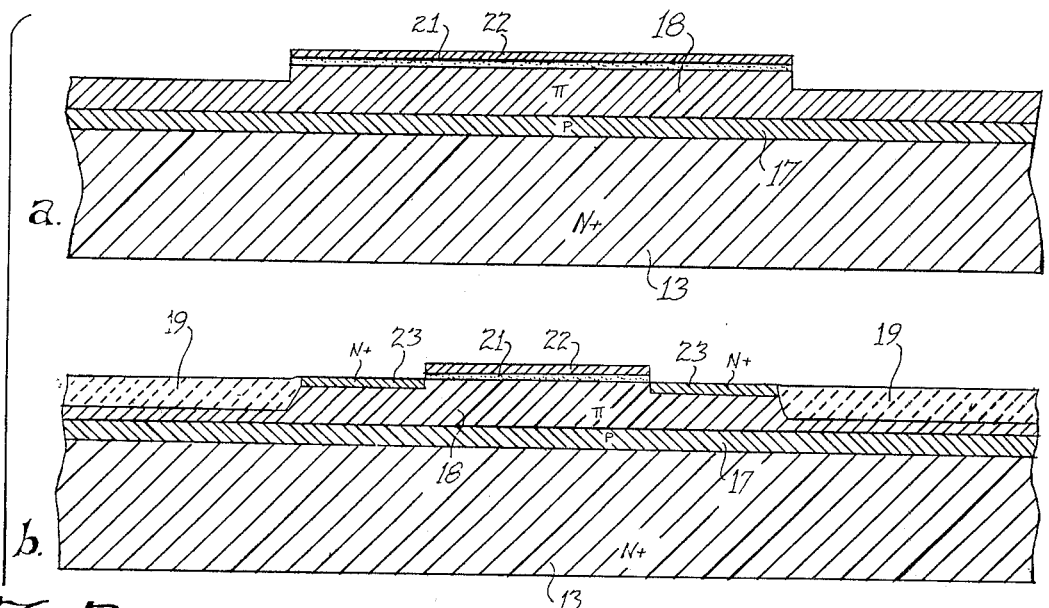
Fig. 2
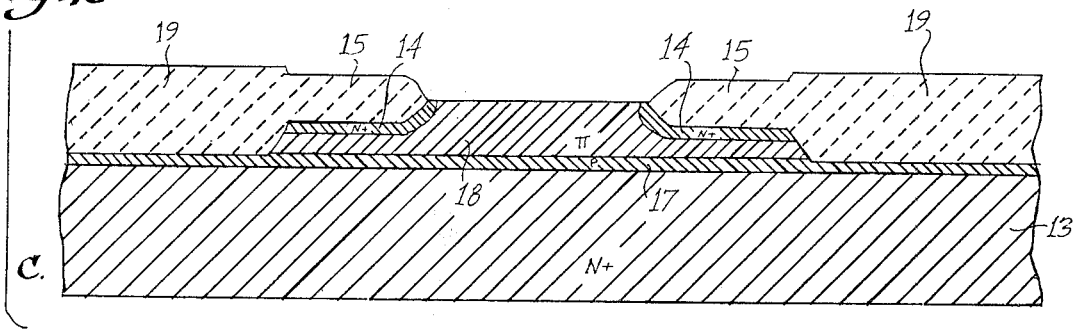

V-GROOVE SEMICONDUCTOR DEVICE WITH BURIED CHANNEL STOP

BACKGROUND OF THE INVENTION

This invention relates to semiconductor devices and methods of manufacture, and more particularly to an insulated gate field effect transistor having a channel stop region.

MOS transistors, particularly N-channel devices, must have "channel stop" regions to prevent the semiconductor material under the field oxide from inverting and forming unwanted transistors. The channel stop regions are usually formed by ion implant before field oxide growth as disclosed in U.S. Pat. No. 4,055,444, issued to G. R. Mohan Rao, assigned to Texas Instruments. The N+ causes high capacitance of the drain or source to channel stop. This capacitance can be a dominant factor in limiting the device speed.

It is the principal object of this invention to provide an improved insulated gate field effect transistor device. Another object is to provide an MOS transistor of small size which has lower source/drain to channel stop capacitance. An additional object is to provide an MOS transistor with channel stop made by a more efficient method. A further object is to provide a higher speed MOS transistor.

SUMMARY OF THE INVENTION

In accordance with an illustrative embodiment of the invention an insulated gate field effect transistor has channel stop regions which are separated from the heavily doped drain region so that the sidewall or drain/source to channel stop capacitance is reduced. This is accomplished by a buried channel region which also functions as the channel stop in a VMOS transistor.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

FIG. 1 is a greatly enlarged section view of a small portion of a semiconductor chip showing an MOS transistor made according to the invention; and FIGS. 2a-2c are elevation views in section of the device of FIG. 1, at successive stages in the manufacturing process.

DETAILED DESCRIPTION OF SPECIFIC EMBODIMENTS

Referring to FIG. 1, an N-channel VMOS transistor according to the invention is illustrated. The transistor is formed in an anisotropically etched V-groove 10 and including a polysilicon gate 11 over thin gate oxide 12, along with an N+ source region 13 which is also the substrate and an N+ drain region 14. The drain region is formed under a field oxide layer 15 and surrounds the V-groove 10. The channel 16 of the transistor is formed by the edge of a P type region 17 where this edge intercepts the V-groove. A very lightly doped P type region 18, which is much more easily inverted than the more heavily doped channel region 16, surrounds the V-groove between the channel and drain. A thick field oxide layer 19 surrounds the transistor.

According to the invention, the P type region 17 extends under the field oxide layer 19 and functions as a channel stop. The region 17 is fairly heavily doped so it will not be inverted by a logic 1 voltage on a conductor which is over the thick field oxide 19, even though it is inverted under the gate 11 since the oxide 12 is very thin.

Turning now to FIGS. 2a-2c, a process for making the device of FIG. 1 according to the invention will be described. The starting material is a slice of N+ type monocrystalline silicon, typically three or four inches in diameter and twenty mils thick, cut on the <100> plane, heavily doped N type. In the FIGURES the portion shown on the bar 13 represents only a very small part of the slice, perhaps about one mil wide. The substrate 13 contains slow-diffusing N type dopant and a lesser concentration of fast-diffusing P-type dopant. First, an epitaxial layer 18 is grown to provide a very lightly doped P-type surface region of about 0.1 to 0.15 mil thickness. During the epi growth and during subsequent heat cycles, the layer 17 is formed by outdiffusion from the substrate 13 to create the P-type channel region. The layer 18 is at a much lower P-type doping level than the layer 17 so the layer 18 is highly resistive and easily inverted. Next, the slice is oxidized at about 1000° C. to produce an oxide layer 21 on top of the epitaxial layer 18 over the entire slice of a thickness of about 1000 Å. Next, a layer 22 of silicon nitride of about 1000 Å thickness is formed by exposing to an atmosphere of trichorsilane and ammonia in a reactor. A coating of photoresis t is applied, exposed to light through a mask defining the pattern of the thick field oxide 19, developed, and exposed areas of nitride and oxide etched away. As seen in FIG. 2a, an etch step removes silicon to about half the depth from the surface to the layer 17 in the layer 18 so that the thickness of oxide 19 required to reach the layer 17 is reduced.

The next step in the process is formation of the initial part of the field oxide 19, which is done by subjecting the slices to steam or an oxidizing atmosphere at above about 900° or 1000° C. for perhaps several hours, growing a thick field oxide layer 19 (seen in FIG. 2b) which extends further into the silicon surface as silicon is consumed. The remaining nitride layer 22 masks oxidation. The thickness of the layer 19 at this point is about 5000 Å, about half of which is above the beginning surface and half below.

The slice is now coated with another photoresist layer, exposed to uV light through a mask which defines the drain areas 14 as well as other areas (not shown) which are to be N+ diffused, developed, then again subjected to etchants which remove the parts of the layer 22 then layer 21 now exposed by holes in the photoresist, exposing bare silicon. A phosphorus diffusion produces the N+ regions 23 which will subsequently become the drains, etc. Instead of diffusion, these N+ regions 23 may be formed by arsenic ion implant, in which case the oxide layer 21 would be left in place and an anneal step as set forth in U.S. Pat. No. 4,055,444 used before the subsequent oxidation.

Referring to FIG. 2c, a second field oxidation step is now performed by placing the slice in steam or dry oxygen at about 1000° C. for several hours. This oxidizes all of the top of the slice not covered by the remaining parts of the nitride layer 22, producing field oxide 15 which is about 5000 Angstroms thickness. During this oxidation, the areas of field oxide 19 grow thicker, to perhaps 10,000 Angstroms. The N+ regions 23 are partly consumed but also diffuse further into the silicon ahead of the oxidation front to create the heavily doped drain regions 14.

The V-groove 15 is now formed by removing the nitride 22 and oxide 21 from this area, then subjecting the slice to an etchant which removes the <100> surface of the silicon, stopping when it reaches a <111> surface. This produces the V-shaped groove 10 having sides 54.7° with respect to the top surface of the silicon. Next any remaining parts of the layer 22 are removed by an etchant which attacks nitride but not silicon oxide, then the oxide 21 is removed by etching. The gate oxide 12 is grown by thermal oxidation to a thickness of about 500.

As seen in FIG. 2c a layer of polycrystalline silicon is deposited over the entire slice in a reactor using standard techniques. The polysilicon layer is patterned by applying a layer of photoresist, exposing to ultraviolet light through a mask prepared for this purpose, developing, then etching. The remaining polysilicon layer provides what will be the gates 12 for the transistor.

Metal contacts and interconnections (not shown) are made in the usual manner by depositing a thin film of aluminum over the entire top surface of the slice over an interlevel insulation then patterning by a photoresist mask and etch sequence.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is, therefore contemplated that the appended claims will cover any such modifications or embodiments as fall within the true scope of the invention.

What is claimed is:

1. A semiconductor device comprising a V-shaped groove in a face of a semiconductor body, a thin insulating coating on said face in said groove, a conductive layer over said coating, a thick insulating coating on the face spaced from the groove, and a buried impurity-doped region in said face extending along the face parallel thereto but spaced therefrom, said thick insulating coating extending into said face to said buried region so the buried region is underlying said thick insulating coating, the v-shaped groove extending into said face deeper than said buried region so the buried region forms parts of walls of the groove.

2. A device according to claim 1 wherein the semiconductor body is silicon of one type and the buried region is an epitaxial region of the opposite type.

3. A device according to claim 2 wherein the groove is anisotropically etched into the <100> plane.

4. A device according to claim 2 wherein the conductive layer is polycrystalline silicon and the thin insulating coating is silicon oxide.

5. A device according to claim 4 wherein the silicon body includes an N+ substrate, and includes a highly resistive epitaxial layer above said buried region.

6. A device according to claim 5 wherein the device is an N-channel MOS transistor and said conductive layer is the gate.

7. A device according to claim 6 wherein said insulating coating is gate oxide and has a thickness much less than said thick insulating coating.

8. A method of making a semiconductor device comprising the steps of:
   growing an epitaxial layer of one type on a face of the opposite type of a semiconductor body,
   outdiffusing from the body to form a buried layer of said one type in said face in the lower part of layer,
   forming a thick insulating coating on said face extending into the face through said epitaxial layer to said buried layer,
   etching said face of the semiconductor body anisotropically to provide a V-shaped groove is an area spaced from the thick insulating coating,
   growing a thin oxide dielectric layer in said groove, and applying a conductive layer over the dielectric layer.

9. A method according to claim 8 including the step of forming a region of said opposite type in said epitaxial layer on said face.

10. A method according to claim 9 wherein the buried layer is much more heavily doped than the epitaxial layer.

* * * * *